United States Patent
Lee et al.

(10) Patent No.: US 7,214,325 B2
(45) Date of Patent: May 8, 2007

(54) METHOD OF FABRICATING OHMIC CONTACT ON N-TYPE GALLIUM NITRIDE (GAN) OF ROOM TEMPERATURE BY PLASMA SURFACE TREATMENT

(75) Inventors: Jong Lam Lee, Kyungbuk (KR); Ho Won Jang, Kyungbuk (KR); Jong Kyu Kim, Seoul (KR); Changmin Jeon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/103,523

(22) Filed: Mar. 22, 2002

(65) Prior Publication Data

US 2002/0155691 A1  Oct. 24, 2002

Related U.S. Application Data

(60) Provisional application No. 60/278,468, filed on Mar. 23, 2001.

(51) Int. Cl.
*H01L 21/44* (2006.01)

(52) U.S. Cl. ............... 216/13; 216/63; 216/67; 216/68; 216/75; 438/604; 438/598; 438/618; 438/172

(58) Field of Classification Search .......... 216/62, 216/24, 57, 68
See application file for complete search history.

(56) References Cited

U.S. PATENT DOCUMENTS

| 5,789,265 | A | 8/1998 | Nitta et al. |
| 5,972,781 | A | 10/1999 | Wegleiter et al. |
| 5,987,048 | A | 11/1999 | Ishikawa et al. |
| 6,072,819 | A | 6/2000 | Shakuda |
| 6,083,841 | A | 7/2000 | Yano et al. |
| 6,100,174 | A | 8/2000 | Takatani |
| 6,242,761 | B1 | 6/2001 | Fujimoto et al. |
| 2001/0010941 | A1 | 8/2001 | Morita |
| 2002/0055265 | A1 | 5/2002 | Ring |

OTHER PUBLICATIONS

Michael Kneissl, et al., "Continuous-Wave Operation of InGaN Multiple-Quantum-Well Laser Diodes on Copper Substrates Obtained by Laser Liftoff", IEEE Journal on Selected Topics in Quantum Electronics, vol. 7, No. 2, Mar./Apr. 2001; pp. 188-191.

William S. Wong, et al., "Continuous-Wave InGaN Multiple-Quantum-Well Laser Diodes on Copper Substrates", Applied Physics Letters vol. 78, No. 9, Feb. 26, 2001; pp. 1198-1200.

William S. Wong, et al., "The integration of $In_xGa_{1-x}N$ Multiple-Quantum-Well Laser Diodes with Copper Substrates by Laser Lift-Off", Jpn. J. Appl. Phys. vol. 39 (2000) pp. L 1203-L 1205, Part 2, No. 12A, Dec. 1, 2000; pp. L1203-L1205.

*Primary Examiner*—Allan Olsen
(74) *Attorney, Agent, or Firm*—McKenna Long & Aldridge LLP (57) ABSTRACT

Forming low contract resistance metal contacts on GaN films by treating a GaN surface using a chlorine gas Inductively Coupled Plasma (ICP) etch process before the metal contacts are formed. Beneficially, the GaN is n-type and doped with Si, while the metal contacts include alternating layers of Ti and Al. Additionally, the GaN film is dipped in a solution of $HCl:H_2O$ prior to metal contact formation.

19 Claims, 8 Drawing Sheets

METHOD OF FABRICATING OHMIC CONTACT ON N-TYPE GALLIUM NITRIDE (GAN) OF ROOM TEMPERATURE BY PLASMA SURFACE TREATMENT

This application claims the benefit of U.S. Provisional Patent Application No. 60/278,468 filed on Mar. 23, 2001, which is hereby incorporated by reference for all purposes as if fully set forth herein.

BACKGROUND OF THE INVENTION

1. Field of the Invention

The present invention relates to a method of fabricating ohmic contact on n-type gallium nitride (GaN) of room temperature by plasma surface treatment.

2. Discussion of the Related Art

Metal contact is one of the most important processes in fabricating opto-electronic devices and high-temperature, high power electronic devices using gallium nitride (GaN)—based compound semiconductors. In particular, ohmic metal contacts with low specific contact resistivity are essential to obtain high performance devices. The ohmic contact is strongly dependent on the interfacial property between metal contacts and the semiconductors. Despite numerous attempts to improve metal contact property, it has been very difficult to fabricate GaN devices with low contact resistivity using the conventional techniques involving Si and GaAs since the work function of the GaN is much higher than the other semiconductor materials.

Figure 1:
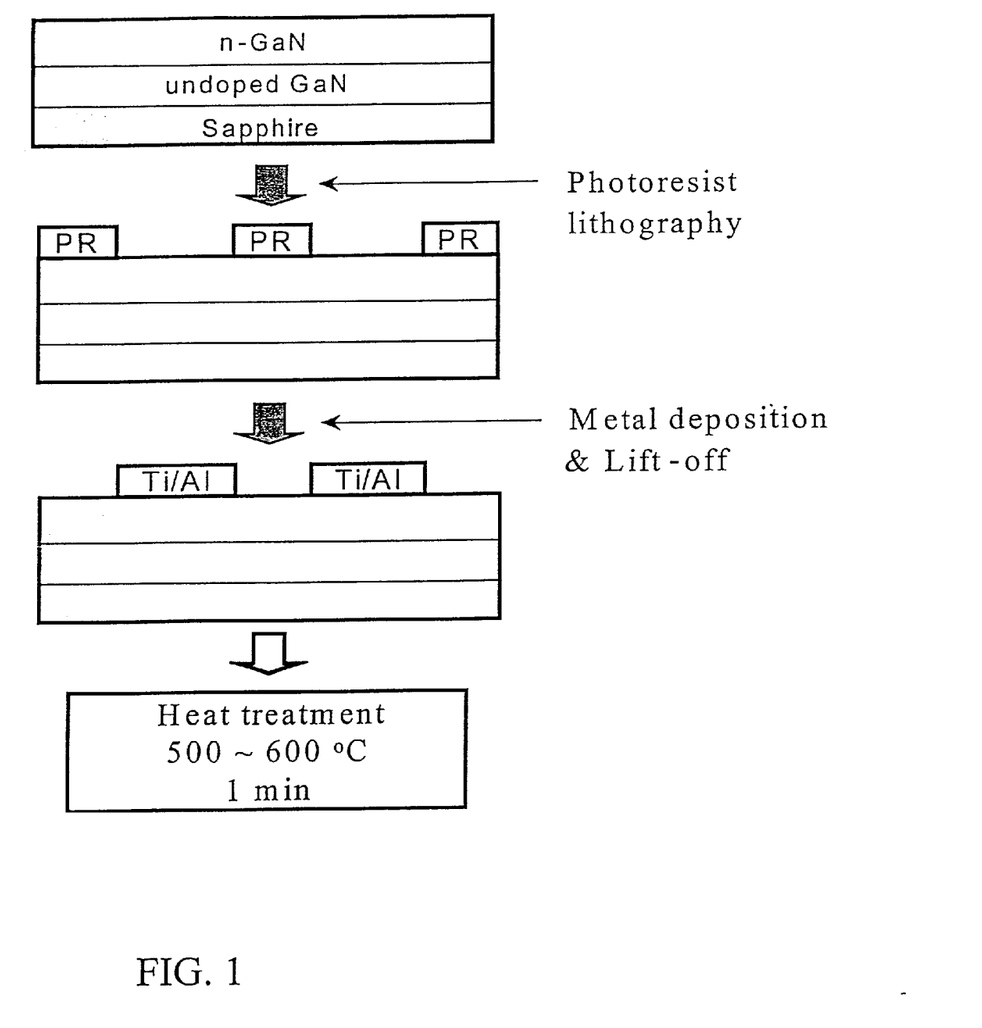
FIG. 1 is a diagram illustrating a conventional method for fabricating a metal ohmic contact.

Obtaining a low ohmic contact having a resistivity less than $10^{-6}$ ohmcm$^2$ by Ti/Al ohmic contact, which is widely used to form n-type ohmic contact on GaN, has been only possible by heat treatment higher than 600 C (see FIG. 1). However, such a high temperature process results in not only limiting the process design for device fabrication but also degrading the device performance. Therefore, a non-alloy heat treatment technique that can be used to obtain a low contact resistivity from the as-deposited metal contact would exhibit substantial advantages in reducing the cost of the fabrication process and improving the device reliability.

SUMMARY OF THE INVENTION

Accordingly, the present invention is directed to a method of fabricating ohmic contact on n-type gallium nitride (GaN) of room temperature by plasma surface treatment that substantially obviates one or more of the problems due to limitations and disadvantages of the related art.

Figure 2:
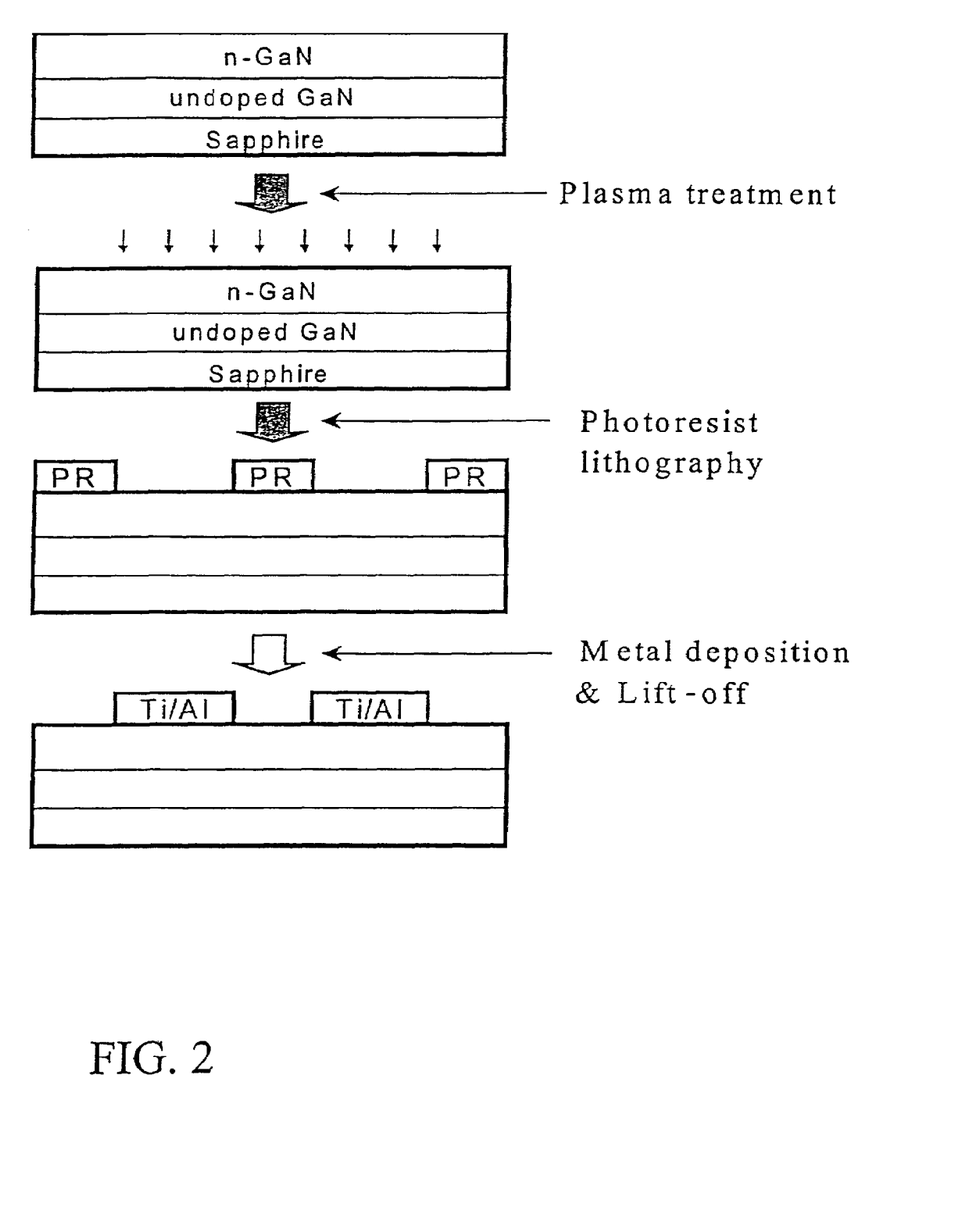
FIG. 2 is a diagram illustrating the method of the present invention for fabricating a metal ohmic contact.

The present invention as illustrated in FIG. 2 comprises a new method of fabricating ohmic contacts by treating the n-type GaN surface using an Inductively Coupled Plasma (ICP) process before ohmic metal formation on the n-type GaN surface. By utilizing this new technique in the n-type ohmic contact formation on the GaN, very low contact resistivity of $9.4 \times 10^{-6}$ ohmcm$^2$ was obtained using ICP treatment with chlorine gas, prior to the deposition of Ti and Al metals. Obtaining such low contact resistivity is only possible with a high temperature heat treatment process used in conventional techniques. After the ICP treatment, it has been observed that nitrogen vacancies, which formed during ICP treatment, play an important role in reducing potential barrier and increasing the number of electrons in the metal and semiconductor interface, hence enabling electron conduction by tunneling effect leads to form an ohmic contact.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIG. 8($a$) is a graph illustrating the change in the bond diagram characteristic in the metal/semiconductor interface after fabricating ohmic contacts using the conventional method.

FIG. 8($b$) is a graph illustrating the change in the bond diagram characteristic in the metal/semiconductor interface after fabricating ohmic contacts using the method of the present invention.

DETAILED DESCRIPTION OF THE ILLUSTRATED EMBODIMENTS

Reference will now be made in detail to an embodiment of the present invention, example of which is illustrated in the accompanying drawings.

As shown in FIG. 2, room-temperature Ti/Al ohmic contact on n-type GaN was obtained by the surface treatment using Cl$_2$ inductively-coupled plasma treatment. The specific contact resistivity was dramatically decreased from Schottky behavior to $9.4 \times 10^{-6}$ Ωcm$^2$ by the treatment. The binding energy of Ga—N bond and the atomic ratio of Ga/N were simultaneously increased after the plasma treatment. This provides evidence that N vacancies, acting as donor for electrons, were produced at the etched surface, resulting in shift of Fermi level to the near from conduction band. This leads to the reduction in contact resistivity through the decrease of Schottky barrier for the conduction of electrons.

Obtaining ohmic contacts on GaN based devices exhibiting low contact resistivity has attracted substantial interest due to the potential of improving electrical and optical performances of such devices. For n-type GaN, ohmic contacts with the lowest contact resistivity of $8\times10^{-6}$ $\Omega cm^2$ have been achieved using Ti/Al metallization after annealing at 900° C. Due to the formation of a TiN layer associated with the interaction of Ti with GaN, a high concentration of N vacancies ($V_N$) could be created near the interface, causing the GaN to be heavily doped n-type. This Ti/Al metal scheme has been used as the standard ohmic contact on n-type GaN.

The pretreatment of surface prior to metal deposition plays a key a role in reducing the contact resistivity on GaN. In this regard, the reactive ion etching (RIE) of n-type GaN using $SiCl_4$ and Ar is effective in reducing contact resistivity. An order of magnitude improvement in the contact resistivity has been demonstrated on both as-deposited Al and Ti/Al contacts on n-type GaN surfaces. However, the origin on the reduction by the pretreatment using RIE is still unclear. Further reduction in the contact resistivity could be achieved by using a proper technique.

The present invention discloses a room temperature ohmic contact on n-type GaN with low resistivity using $Cl_2$ inductively coupled plasma (ICP) etching, which has a faster etching rate and less surface damage than RIE. Angle resolved X-ray photoelectron spectroscopy (XPS) was employed to examine the atomic composition at the etched surface. From this, the ohmic contact formation mechanism on n-type GaN is discussed.

GaN films were grown by metal-organic chemical vapor deposition on sapphire substrate. An undoped GaN buffer layer with a thickness of 1 μm was grown, followed by the growth of 1-μm-thick n-type GaN doped with Si. The carrier concentration was $1.2\times10^{18}$ $cm^{-3}$, determined by the Hall measurements. Two types of samples were prepared. One set was prepared by deoxidizing the grown sample using HCl solution as grown (HCl-treated) and the other was treated by $Cl_2$-ICP for 3 minutes (ICP-treated). In the ICP treatment the base pressure of $5\times10^{-5}$ Torr and the flow rate of 10 sccm of $Cl_2$ were used. For the measurement of contact resistivity, circular transmission line pads with a radius of 100 μm and gap spacings (3, 6, 9, 12, 15 and 18 μm) between pads were patterned on both samples by a photoresist. The patterned samples were dipped into a $HCl:H_2O$ (1:1) solution for 3min to remove native oxides, possibly formed during the ICP treatment, followed by the deposition of Ti(300 Å) and Al(1000 Å) layers in sequence using electron beam evaporator. Current-voltage (I-V) measurements were carried out by four-point probe technique.

To investigate the chemical bonding state at the etched surface by the angle resolved XPS, three types of samples were prepared. One set was the as-grown, the second one was the ICP-treated and the third one was prepared by dipping the ICP-treated sample into the HCl solution before loading to a XPS chamber. These schemes are consistent with the main steps in the preparation for the ICP-treated sample in the electrical measurements.

Figure 3:
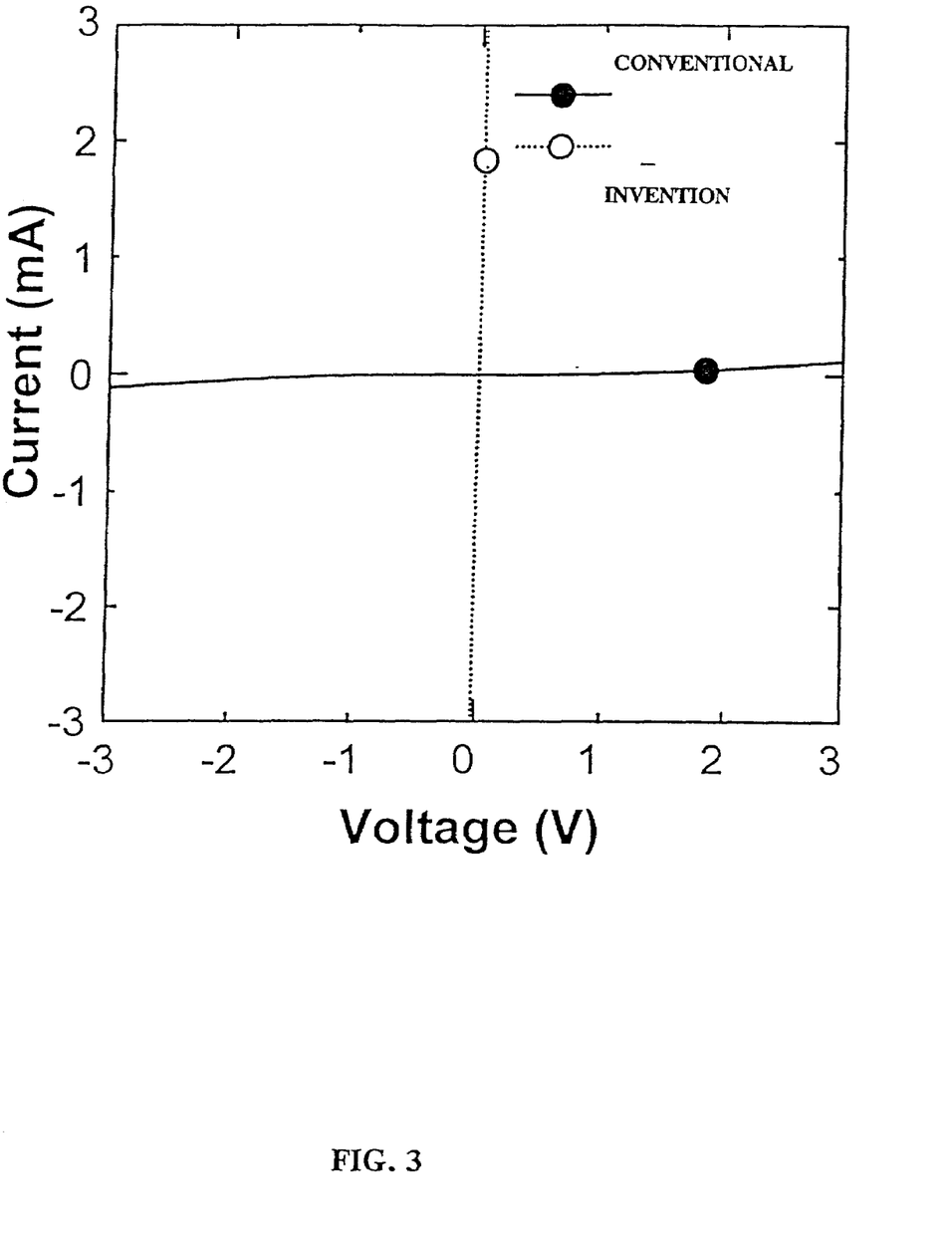
FIG. 3 is a graph showing a comparison of the current and voltage characteristics of ohmic contacts fabricated using the conventional method and the method of the present invention.
Figure 4:
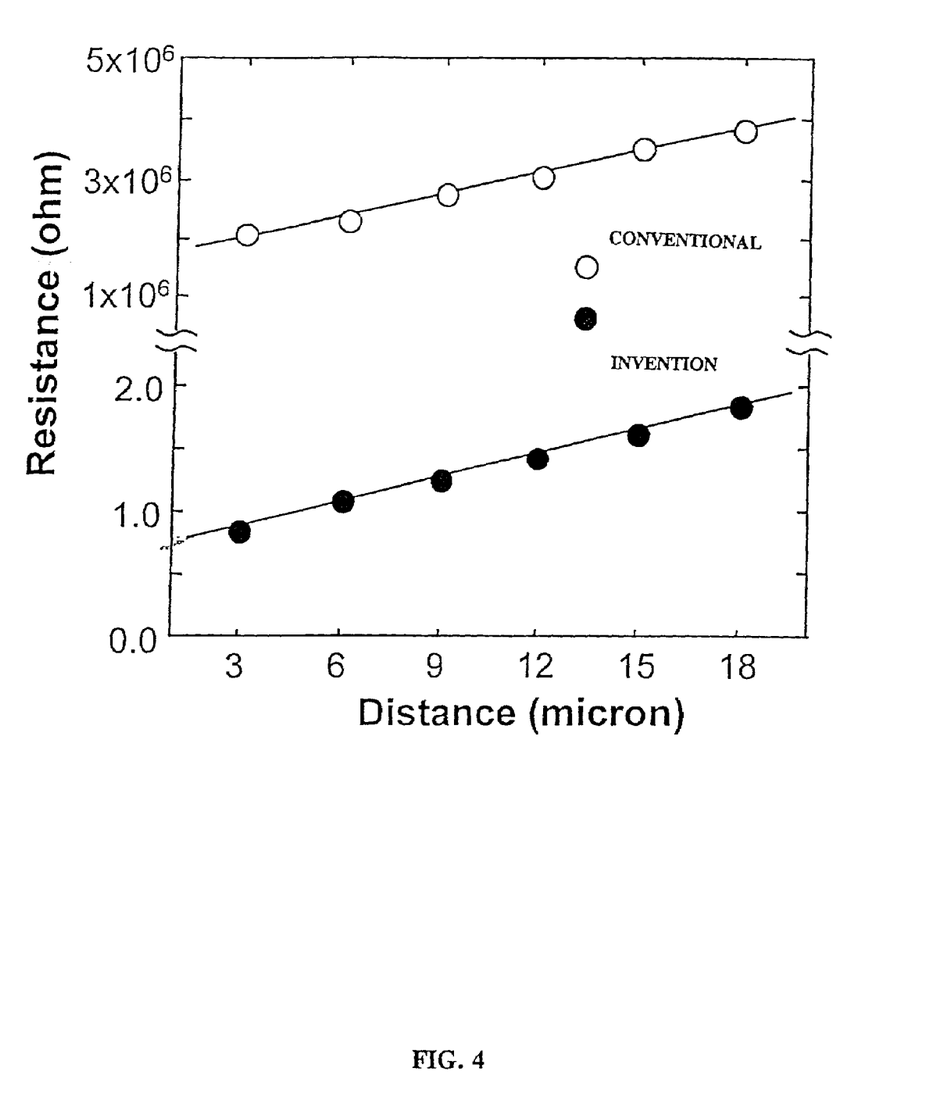
FIG. 4 is a graph showing a comparison of the resistance and electrode spacing characteristics of ohmic contacts fabricated using the conventional method and the method of the present invention.

FIG. 3 shows the current version voltage characteristics (I-V curve) for the as-grown HCl-treated and the ICP-treated samples, measured between the ohmic pads with a spacing of 3 μm. The I-V curve in the HCl-treated sample is nonlinear, showing a completely rectifying contact characteristic over the whole range of voltages. However, the curve from the ICP-treated sample is linear, showing a good ohmic characteristic. To determine the specific contact resistivity of both samples, resistances for the each spacing were measured at a voltage of 0 V, plotted in FIG. 4. The specific contact resistivity for the ICP-treated sample is evaluated to be $9.4\times10^{-6}\Omega cm^2$. It must be considered that the contact resistivity obtained is surprisingly low and compatible to the previous results achieved through the high temperature annealing.

Figure 5:
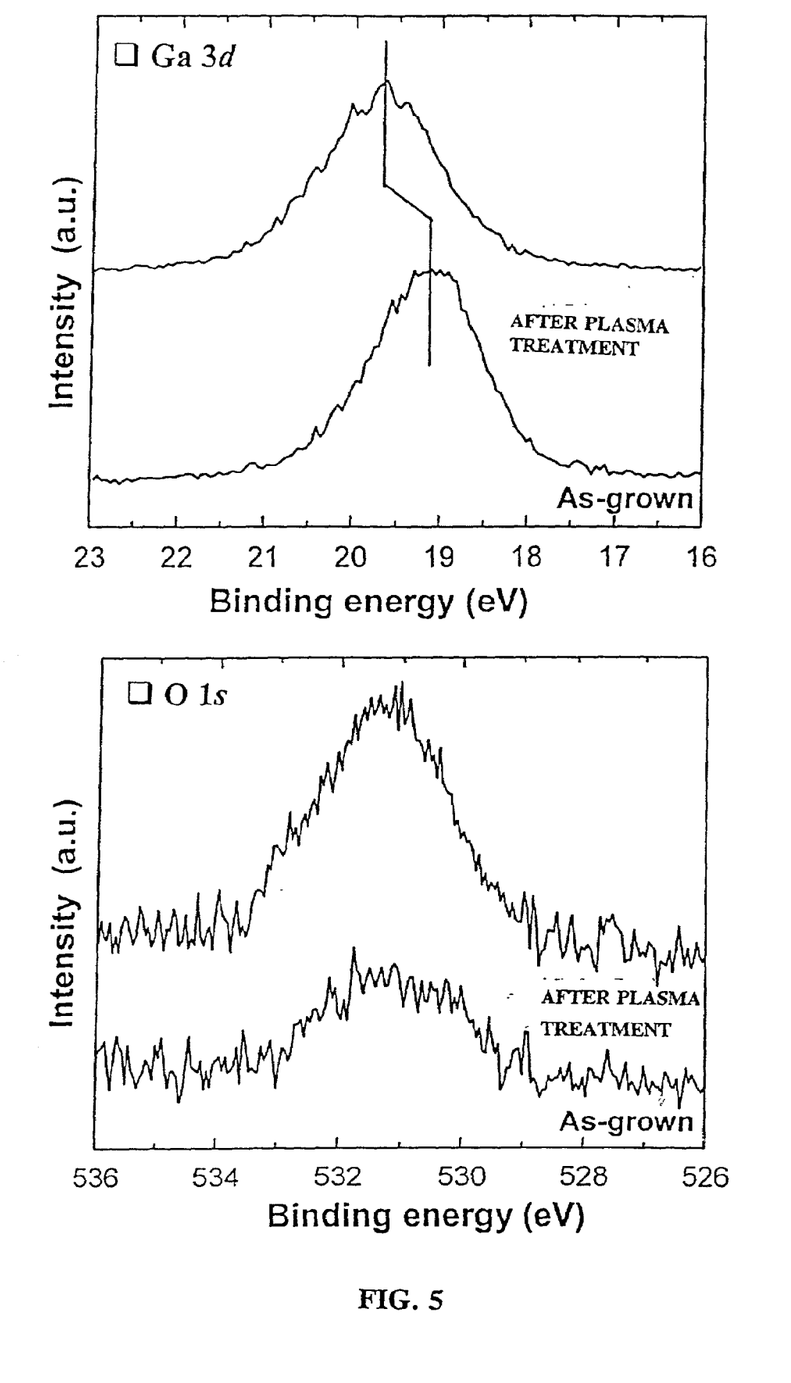
FIG. 5 presents two graphs illustrating the variation in binding energy of the n-GaN surface after ICP treatment.

The chemical composition at the surface of n-type GaN was characterized with the steps of surface treatment using XPS. FIG. 5 (top) exhibits the XPS spectra of Ga 3d photoelectrons for the samples at normal detection. After surface treatments using $Cl_2$ ICP and HCl solution in sequence, the peak for Ga—N bond shifts respectively by 0.54 eV and 0.45 eV toward higher binding energies. This suggests that the Fermi level, $E_F$, at the surface of n-type GaN moves near the conduction band edge by the ICP treatment, resulting in the decrease of effective Schottky barrier height (SBH) for electron transport. XPS spectra of O 1s photoelectrons are shown in FIG. 5 (bottom). The peak intensity corresponding to O 1s photoelectrons is increased by the ICP treatment. The peak area in the ICP-etched sample is larger by 2.4 times than that in the as-grown one. This indicates that a large number of Ga oxides were formed during the ICP treatment. When the ICP-etched sample was treated with HCl solution, the peak area reduced to the area of the as-grown sample. This suggests that the Ga oxides unintentionally formed during the $Cl_2$ plasma could be removed by the HCl solution treatment.

The angle resolved XPS was employed to obtain the chemical composition at the near-surface region. The actual escape depth of photoelectrons λ depends on the mean-free-path of electrons $\lambda_m$ and the detection angel θ from the parallel to the surface, that is, $\lambda=\lambda_m \sin\theta$. Photoelectron signal at the smaller θ is mainly contributed from the surface region, while the contribution from the bulk GaN becomes dominant at the larger θ. For Ga 3d photoelectrons, $\lambda_m$ with Al Kα X-ray source is 49.7 Å. Thus, λ is calculated to be 17 Å at θ=20°. The atomic ratio of Ga/N was determined from the atomic concentrations of each element, which was calculated from the integral peak intensities of Ga 3d, N is, C 1s, O 1s spectra and their sensitivity factors. The variation of the Ga/N ratio with the step of surface treatment was plotted in FIG. 6. The value of the Ga/N ratio at the normal detection (θ=90°) was set as 1.0 for reference. As the detection angle decreases, the Ga/N atomic ratio increases. The increase in the Ga/N ratio is more pronounced in both ICP-treated samples. This informs that a number of $V_N$ were produced at the near surface region by the ICP treatment, resulting in the production of a Ga-rich surface. The difference in the Ga/N ratios between both ICP-treated samples could be explained by the difference in an amount of oxygen at the surface of GaN, as shown in FIG. 5 (bottom).

Figure 6:
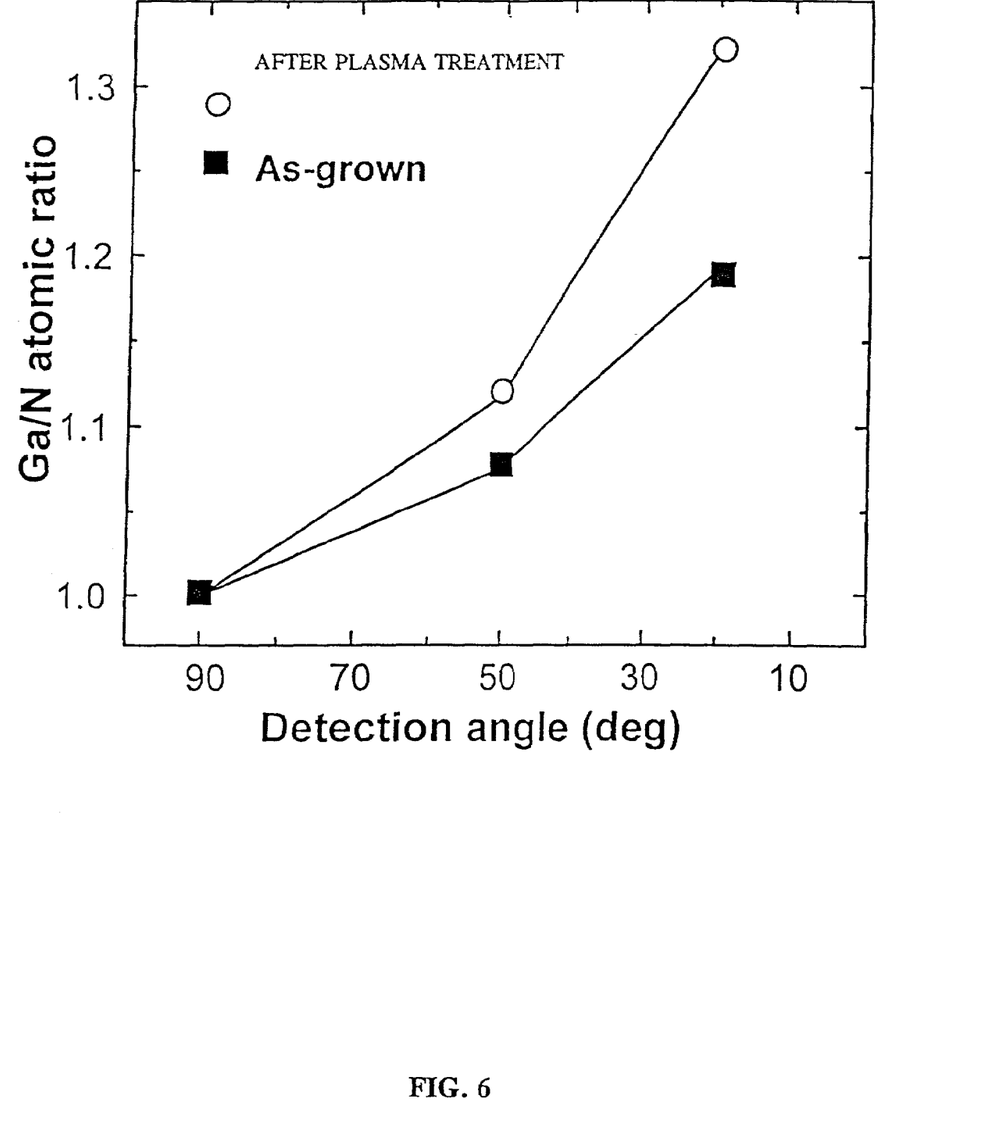
FIG. 6 presents a graph illustrating the variation of the ratio of GaN on the surface of N-GaN after ICP treatment.
Figure 7:
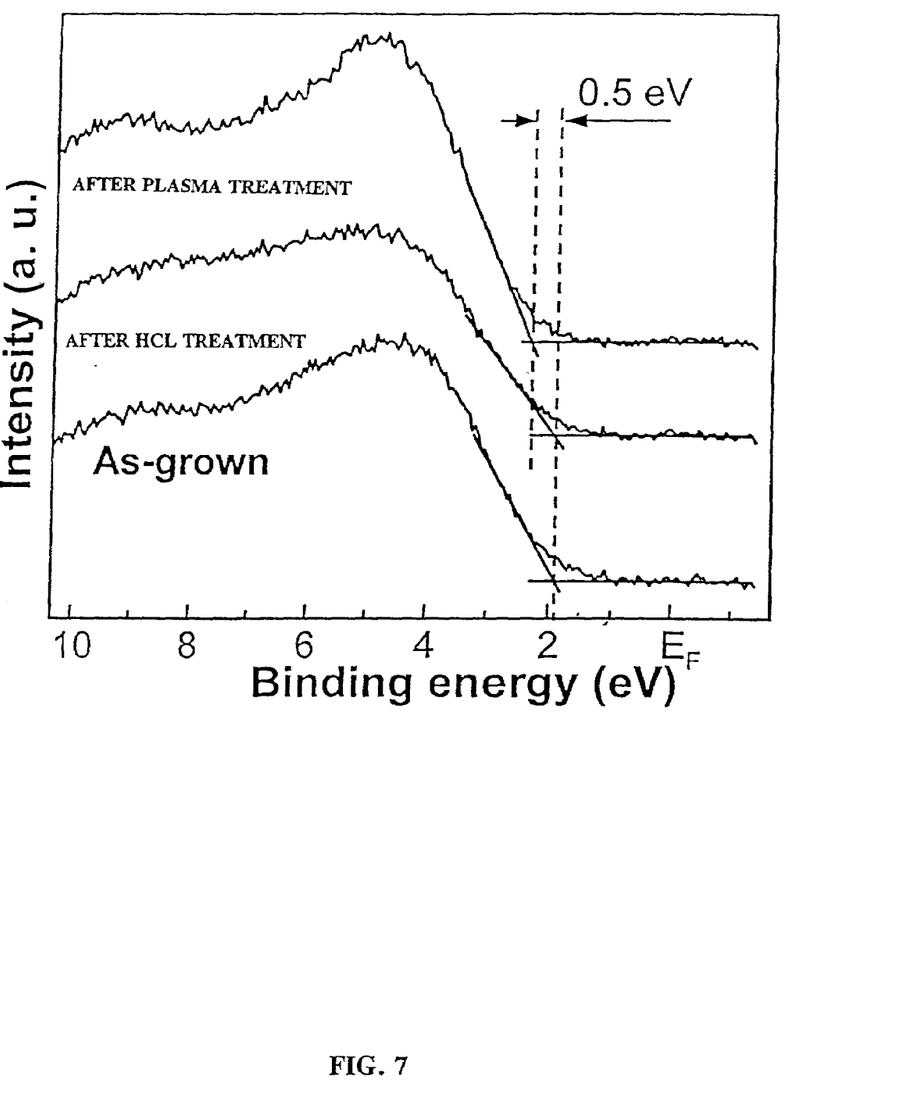
FIG. 7 is a graph illustrating the Fermi energy level variation of the n-GaN surface after ICP treatment.
Figure 8:
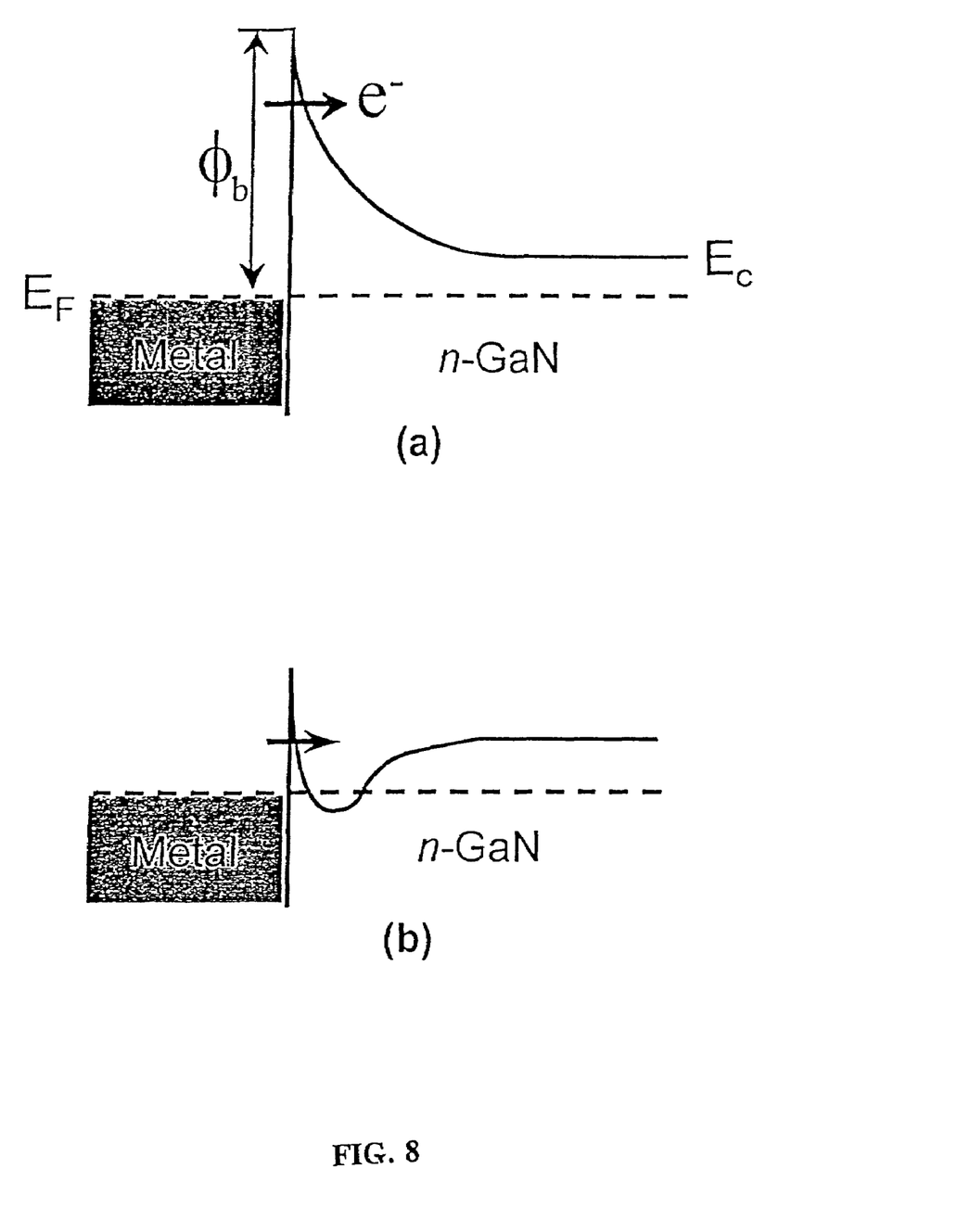

The dramatic improvement in contact resistivity owning to the pretreatment is explained with the energy band diagram below the interface of Ti/n-type GaN. The contact on the HCl-treated sample showed a rectifying behavior, as shown in FIG. 8(a), because the SBH of Ti/n-typo GaN is 0.58 eV. This suggests that the amount of $V_N$ in as-grown n-type GaN is not enough to yield a room-temperature ohmic contact. However, a number of $V_N$ are created, as shown in FIG. 6, when the surface is treated with the ICP. The $V_N$ are located at the shallow level with an energy level about 30~40 meV below the conduction band edge. Thus, $E_F$ shifts to the energy level of $V_N$ via the decrease of band bending, as shown in FIG. 5 (top), leading to the reduction of SBH for the transport of electrons. In addition, the $V_N$ produced during the treatment could be autoionized immediately into a hydrogenic configuration due to the atmosphere temperature of about 500 K in the ICP chamber, leading to the higher electron concentration at the near surface. Thus, both the reduction of SBH and the increase of the electron concentration result in the dramatic decrease in contact resistivity, as shown in FIG. 8(b). The decrease in the downward band bending at the surface region by the ICP treatment is expected to be ~0.5 eV considering the results in FIG. 5 (top).

The creation of $V_N$ at the ICP-treated surface could be explained through the formation of Ga oxides during the plasma process. In FIG. 5 (bottom), the full-width-at-half-maximum value in Ga 3d spectra increases with the ICP treatment. This means that Ga—O bonds were superimposed to the spectra. The binding energy of Ga—O bond is higher than that of Ga—N one. Thus, the vaporization of Ga atoms could be suppressed by the formation of Ga—O bond, leading to the predominant release of N atoms. Consequently, the surface of n-type GaN becomes Ga-rich by the ICP treatment, resulting in the production of $V_N$ at the near surface region.

In conclusion, a specific contact resistance as low as $9.4 \times 10^{-6}$ $\Omega cm^2$ on n-type GaN was obtained by the $Cl_2$ ICP treatment prior to deposition of Ti/Al. Increases in both Ga—N binding energy and O 1s peak intensity were found in the XPS measurements of ICP-treated samples. This originates from the increase in atomic ratio of Ga/N after the ICP treatment via production of $V_N$. Therefore, $E_F$ at the ICP-treated surface shifts to the higher energy level, leading to the decrease in the SBH for electron transport and the dramatic reduction of contact resistivity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of forming a metal contact on a GaN layer, comprising:
    obtaining an n-type GaN substrate;
    performing a $Cl_2$ plasma surface treatment using an inductively-coupled plasma (ICP) method on the entire surface of the GaN substrate; and
    forming a metal contact on the plasma treated surface of the GaN substrate, wherein the metal contact forms an ohmic contact with the n-type GaN substrate.

2. The method of forming a metal contact according to claim 1, wherein the metal contact includes Ti.

3. The method of forming a metal contact according to claim 1, wherein the metal contact includes Al.

4. The method of forming a metal contact according to claim 1, wherein the $Cl_2$ plasma treatment is performed at a base pressure of about $5 \times 10^{-5}$ Torr and at a flow rate of about 10 sccm of $Cl_2$.

5. A method of forming a metal contact on a semiconductor, comprising:
    growing an undoped GaN film on a sapphire substrate;
    forming an n-type GaN film on the undoped GaN film;
    performing a $Cl_2$ plasma surface treatment using an inductively-coupled plasma (ICP) method on the entire surface of the n-type GaN film; and
    forming a metallic contact on the plasma treated surface of the n-type GaN film, wherein the metallic contact forms an ohmic contact with the n-type GaN film without any further treatment after the formation of the metal contact.

6. The method of forming a metal contact according to claim 5, wherein the metal contact includes Ti.

7. The method of forming a metal contact according to claim 5, wherein the metal contact includes Al.

8. The method of forming a metal contact according to claim 5, wherein the undoped GaN film is grown by metal-organic chemical vapor deposition.

9. The method of forming a metal contact according to claim 5, wherein the undoped GaN film has a thickness of about 1 μm.

10. The method of forming a metal contact according to claim 5, wherein the n-type GaN film is doped with Si.

11. The method of forming a metal contact according to claim 5, wherein the n-type GaN film is treated with $HCl:H_2O$ (1:1) before the metal contact is formed.

12. A method of producing a metal contact on a semiconductor, comprising:
    forming an n-type GaN film on a substrate;
    performing a $Cl_2$ plasma treatment using an inductively-coupled plasma (ICP) method on the entire surface of the n-type GaN film; treating the surface of the n-type GaN film with $HCl:H_2O$ after performing the $Cl_2$ plasma treatment; and
    forming a metallic pad on the surface of the GaN film treated with $HCl:H_2O$, wherein the metal pad forms an ohmic contact with the n-type GaN film.

13. The method of forming a metal contact according to claim 12, wherein the metal contact includes Ti.

14. The method of forming a metal contact according to claim 13, wherein the metal contact includes Al.

15. The method of forming a metal contact according to claim 14, wherein the formed metal contact includes alternating layers of Ti and Al.

16. The method of forming a metal contact according to claim 15, wherein the alternating layers of Ti and Al are formed using an electron beam evaporator.

17. The method of forming a metal contact according to claim 12, wherein the n-type GaN film is doped with Si.

18. The method of forming a metal contact according to claim 12, wherein the n-type GaN film is dipped in an $HCl:H_2O$ (1:1) solution.

19. A method of forming a metal contact on a GaN layer, comprising:
    obtaining an n-type GaN substrate;
    performing a $Cl_2$ plasma surface etching on the GaN substrate with same thickness through the entire surface treatment using an inductively-coupled plasma (ICP) method on the surface of the GaN substrate; and
    forming a metal contact on the plasma treated surface of the GaN substrate, wherein the metal contact forms an ohmic contact with the n-type GaN substrate.

* * * * *